US008795488B2

(12) United States Patent
Rasheed et al.

(10) Patent No.: US 8,795,488 B2
(45) Date of Patent: Aug. 5, 2014

(54) APPARATUS FOR PHYSICAL VAPOR DEPOSITION HAVING CENTRALLY FED RF ENERGY

(75) Inventors: Muhammad Rasheed, San Jose, CA (US); Lara Hawrylchak, Gilroy, CA (US); Michael S. Cox, Gilroy, CA (US); Donny Young, San Jose, CA (US); Kirankumar Savandaiah, Karnataka (IN); Alan Ritchie, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 516 days.

(21) Appl. No.: 13/048,440

(22) Filed: Mar. 15, 2011

(65) Prior Publication Data
US 2011/0240464 A1 Oct. 6, 2011

Related U.S. Application Data

(60) Provisional application No. 61/319,377, filed on Mar. 31, 2010, provisional application No. 61/328,725, filed on Apr. 28, 2010, provisional application No. 61/371,774, filed on Aug. 9, 2010, provisional application No. 61/393,309, filed on Oct. 14, 2010.

(51) Int. Cl.
*C23C 14/40* (2006.01)
(52) U.S. Cl.
USPC ............. 204/298.11; 204/298.08; 204/298.02
(58) Field of Classification Search
USPC .............................. 204/298.2, 298.11, 298.08
See application file for complete search history.

(56) References Cited

U.S. PATENT DOCUMENTS

| 7,179,351 B1 | 2/2007 | Juliano et al. |
| 7,244,344 B2 | 7/2007 | Brown et al. |
| 2002/0185370 A1 | 12/2002 | Gopalraja et al. |
| 2008/0083610 A1 | 4/2008 | Tang et al. |
| 2008/0142359 A1 | 6/2008 | Gopalraja et al. |
| 2010/0096261 A1 | 4/2010 | Hoffman et al. |
| 2010/0264017 A1 | 10/2010 | Nam et al. |

FOREIGN PATENT DOCUMENTS

JP 01-309965 A 12/1989

OTHER PUBLICATIONS

International Search Report and Written Opinion mailed Dec. 7, 2011 for PCT Application No. PCT/US2011/030226.
U.S. Appl. No. 13/075,841, filed Mar. 30, 2011, Ritchie et al.
Search Report from the State Intellectual Property Office of the People's Republic of China received Feb. 21, 2014 for Chinese Patent Application No. 201180020863X.

*Primary Examiner* — Keith Hendricks
*Assistant Examiner* — Jason M Berman
(74) *Attorney, Agent, or Firm* — Moser Taboada; Alan Taboada

(57) ABSTRACT

In some embodiments, a feed structure to couple RF energy to a target may include a body having a first end to receive RF energy and a second end opposite the first end to couple the RF energy to a target, the body further having a central opening disposed through the body from the first end to the second end; a first member coupled to the body at the first end, wherein the first member comprises a first element circumscribing the body and extending radially outward from the body, and one or more terminals disposed in the first member to receive RF energy from an RF power source; and a source distribution plate coupled to the second end of the body to distribute the RF energy to the target, wherein the source distribution plate includes a hole disposed through the plate and aligned with the central opening of the body.

20 Claims, 6 Drawing Sheets

US 8,795,488 B2

APPARATUS FOR PHYSICAL VAPOR DEPOSITION HAVING CENTRALLY FED RF ENERGY

CROSS-REFERENCE TO RELATED APPLICATIONS

This application claims benefit of U.S. provisional patent application Ser. No. 61/319,377, filed Mar. 31, 2010, U.S. provisional patent application Ser. No. 61/328,725, filed Apr. 28, 2010, U.S. provisional patent application Ser. No. 61/371,774, filed Aug. 9, 2010, and U.S. provisional patent application Ser. No. 61/393,309, filed Oct. 14, 2010, each of which are herein incorporated by reference.

FIELD

Embodiments of the present invention generally relate to physical vapor deposition processing equipment.

BACKGROUND

Some conventional radio frequency (RF) physical vapor deposition (PVD) chambers provide RF and DC energy to a sputtering target via electrical feeds coupled to the sputtering target. The inventors have discovered that conventional PVD chambers having RF and DC energy coupled to the target provide non-uniform deposition profiles on substrates being processed.

Accordingly, the inventors have provided an improved RF feed structure and PVD chamber incorporating same.

SUMMARY

Methods and apparatus for physical vapor deposition are provided. In some embodiments, a feed structure to couple RF energy to a target in a physical vapor deposition chamber may include a body having a first end to receive RF energy and a second end opposite the first end to couple the RF energy to a target, the body further having a central opening disposed through the body from the first end to the second end; a first member coupled to the body at the first end, wherein the first member comprises a first element circumscribing the body and extending radially outward from the body, and one or more terminals disposed in the first member to receive RF energy from an RF power source; and a source distribution plate coupled to the second end of the body to distribute the RF energy to the target, wherein the source distribution plate includes a hole disposed through the plate and aligned with the central opening of the body.

In some embodiments, an apparatus for physical vapor deposition may include an RF power source to provide RF energy; a process chamber having a substrate support disposed in an interior of the process chamber and a target disposed in the interior of the process chamber facing a support surface of the substrate support; a source distribution plate disposed outside of the process chamber and coupled to a backside of the target along a peripheral edge of the target to distribute the RF energy proximate the peripheral edge of the target; and a body having a first end, a second end opposite the first end, a central opening disposed through the body from the first end to the second end, and a first member coupled to the body at the first end; wherein the first member comprises a first element circumscribing the body and extending radially outward from the body, and one or more terminals disposed in the first member, wherein at least one of the one or more terminals are coupled to the RF power source; and wherein the second end of the body is coupled to the source distribution plate on a first side of the source distribution plate opposite the target.

In some embodiments, an apparatus for physical vapor deposition may include an RF power source to provide RF energy; a process chamber having a substrate support disposed in an interior of the process chamber and a target disposed in the interior of the process chamber facing a support surface of the substrate support; a source distribution plate disposed outside of the process chamber and coupled to a backside of the target along a peripheral edge of the target to distribute the RF energy proximate the peripheral edge of the target; and a body having a first end, a second end opposite the first end, a central opening disposed through the body from the first end to the second end, and a first member coupled to the body at the first end; wherein the first member comprises a first element circumscribing the body and extending radially outward from the body, a cantilevered arm extending from the first element, a terminal disposed in the cantilevered arm to receive the RF energy from the RF power source, and a slot disposed through the first element between the terminal and the body to direct the RF energy from the terminal to the body around the slot, wherein the slot has an arc length of about 180 to about less than 360 degrees; and wherein the second end of the body is coupled to the source distribution plate on a first side of the source distribution plate opposite the target.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
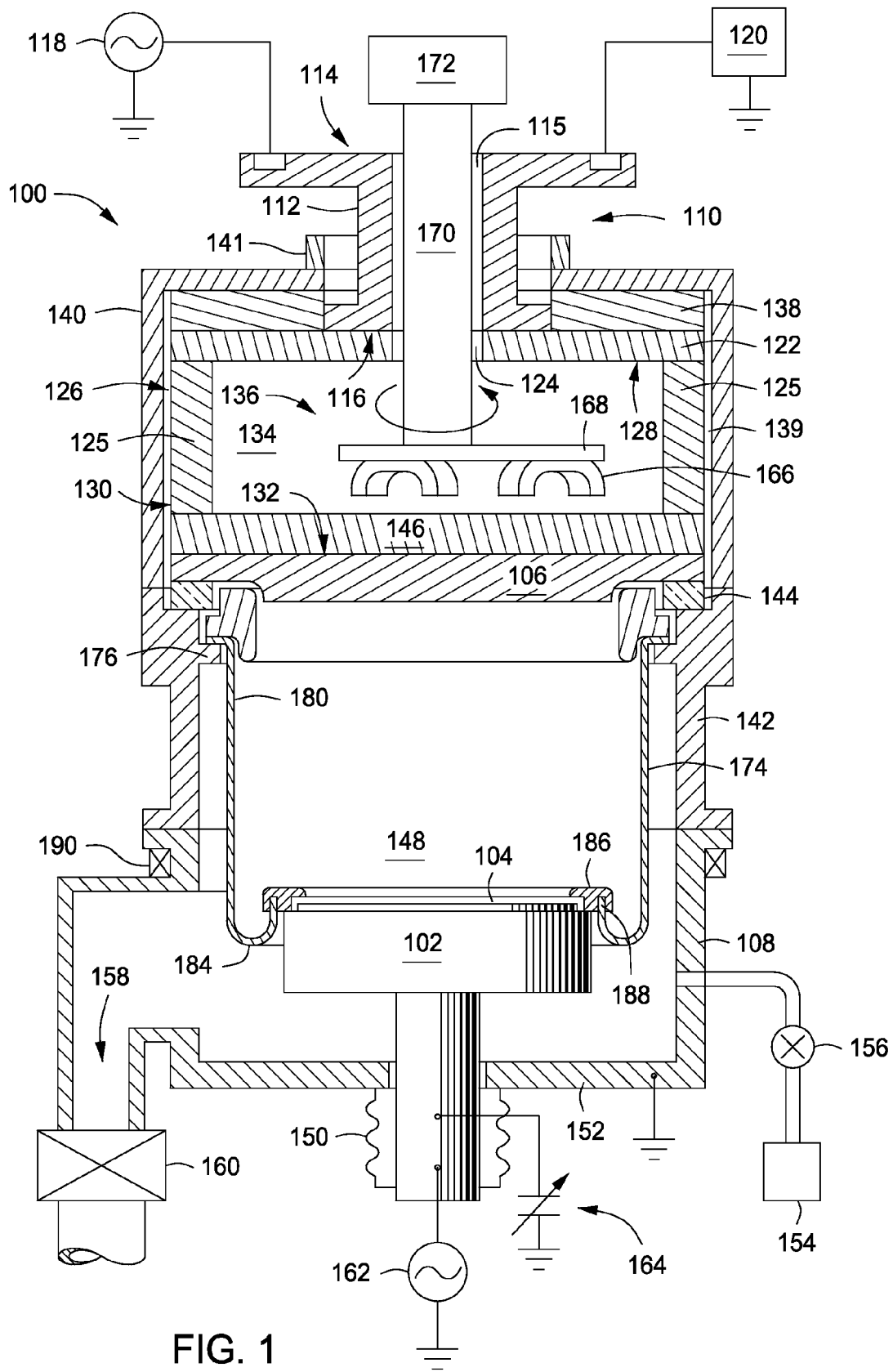
FIG. 1 depicts a schematic cross sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus coupling RF and optionally DC energy, or power, to a target of a physical vapor deposition (PVD) chamber, and physical vapor deposition (PVD) chambers having centrally fed RF and optionally DC power coupled to a target are provided herein. The inventive apparatus advantageously allows for the coupling of RF and DC power to a target in a physical vapor deposition (PVD) chamber such that electromagnetic fields proximate the target and within the chamber are more uniform, thereby facilitating more uniform distribution of the target material on a substrate being processed. In some embodiments, the inventive apparatus is beneficial to high pressure radio frequency (RF) PVD applications, such as pressures ranging from about 1 to about 500 mTorr. Low pressure RF PVD can also benefit from the inventive apparatus disclosed herein.

FIG. 1 depicts a schematic, cross-sectional view of a physical vapor deposition chamber (processing chamber 100) in accordance with some embodiments of the present invention. Examples of suitable PVD chambers include the ALPS® Plus and SIP ENCORE® PVD processing chambers, both commercially available from Applied Materials, Inc., of Santa Clara, Calif. Other processing chambers from Applied Materials, Inc. or other manufactures may also benefit from the inventive apparatus disclosed herein.

The processing chamber 100 contains a substrate support pedestal 102 for receiving a substrate 104 thereon, and a sputtering source, such as a target 106. The substrate support pedestal 102 may be located within a grounded enclosure wall 108, which may be a chamber wall (as shown) or a grounded shield. A ground shield 140 is shown covering at least some portions of the chamber 100 above the target 106 in FIG. 1. In some embodiments, the ground shield 140 could be extended below the target to enclose the pedestal 102 as well.

The processing chamber includes a feed structure 110 for coupling RF and DC energy to the target 106. The feed structure is an apparatus for coupling RF energy, and optionally DC energy, to the target, or to an assembly containing the target, for example, as described herein. In some embodiments, the feed structure 110 may be tubular. As used herein, tubular refers generally to a hollow member having any general cross-section, and not just circular cross-sections. The feed structure 110 includes a body 112 having a first end 114 and a second end 116 opposite the first end 114. In some embodiments, the body 112 further includes a central opening 115 disposed through the body 112 from the first end 114 to the second end 116.

The first end 114 of the feed structure 110 can be coupled to an RF power source 118 and, optionally, a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure 110 may be fabricated from suitable conductive materials to conduct the RF and DC energy from the RF power source 118 and the DC power source 120. Optionally, the DC power source 120 may be alternatively coupled to the target without going through the feed structure 110 (as shown in phantom in FIG. 1).

Figure 3:
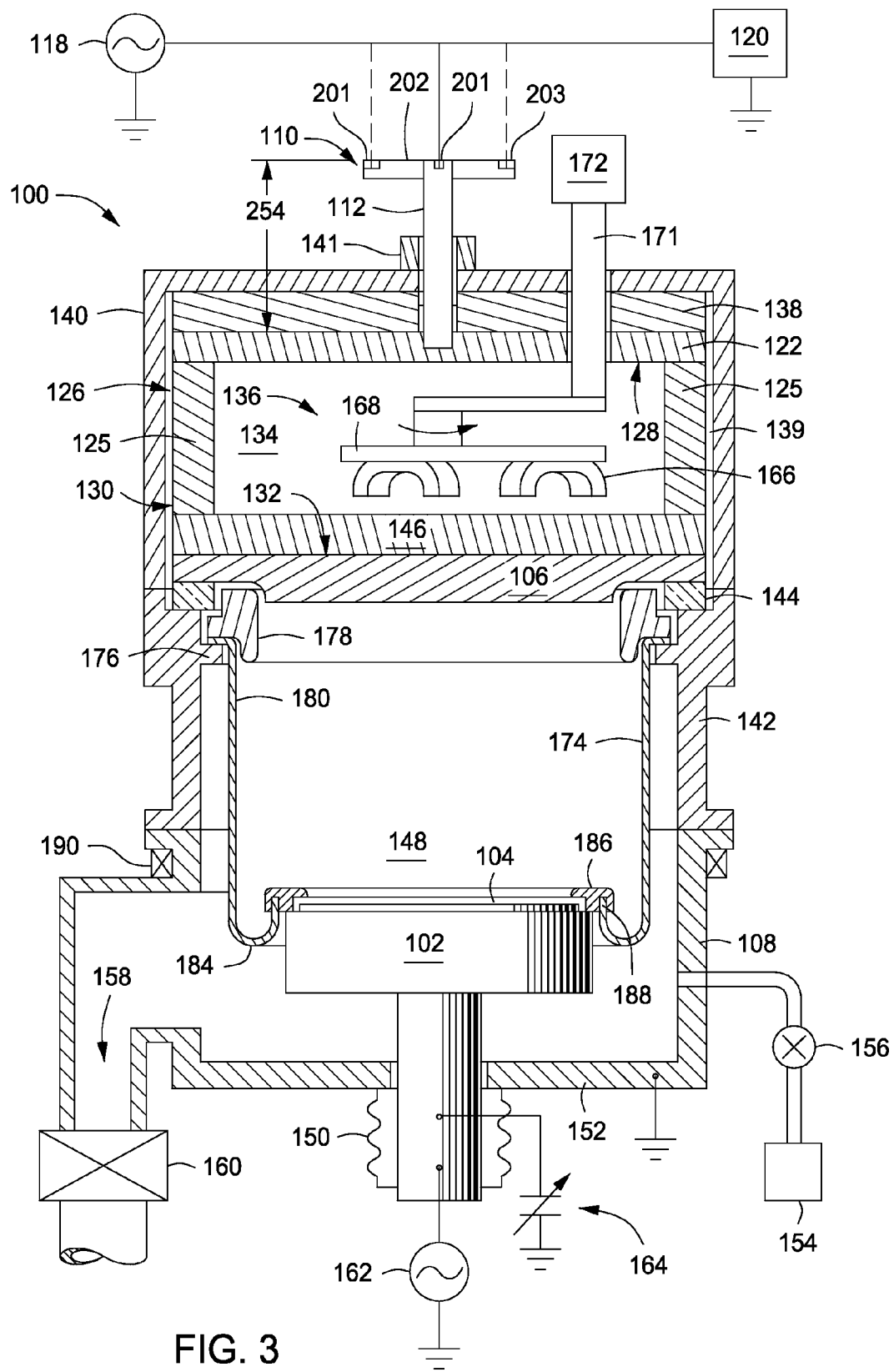
FIG. 3 depicts a schematic cross sectional view of a process chamber in accordance with some embodiments of the present invention.

The feed structure 110 may have a suitable length 254 that facilitates substantially uniform distribution of the respective RF and DC energy about the perimeter of the feed structure 110. For example, in some embodiments, the feed structure 110 may have a length 254 of about 0.75 to about 12 inches, or about 3.26 inches. In some embodiments, where the body 112 does not have a central opening (as discussed below and as shown in FIG. 3), the feed structure 110 may have a length 254 of about 0.5 to about 12 inches.

In some embodiments, the body may have a length to inner diameter (ID 252) ratio of at least about 1:1. In some embodiments, the body may have a length to outer diameter (OD 250) ratio of at least about 0.5:1, for example, about 0.6:1. The inventors have discovered that providing a length to ID ratio of at least 1:1 or longer or a length to OD ratio of at least 0.5:1 or longer provides for more uniform RF delivery from the feed structure 110 (i.e., the RF energy is more uniformly distributed about the feed structure to approximate RF coupling to the true center point of the feed structure 110.

The inner diameter 252 of the feed structure 110 (i.e., the diameter of the central opening 115) may be as small as possible, for example, from about 1 inch to about 11 inches, or about 3.9 inches, while still allowing for the magnetron shaft to extend therethrough. In some embodiments, where no magnetron shaft is present (for example, where a magnetron is not used or wherein the magnetron is controlled in a manner other than via a shaft centrally disposed above the backside of the target, such as via an off-center shaft as shown in FIG. 3), the inner diameter 252 of the feed structure 110 may be a small as zero inches (e.g., the body 112 may be provided without the central opening 115). In such embodiments, the inner diameter 252, if any, of the feed structure 110 may be, for example, from about 0 inches to about 11 inches.

The outer diameter 250 of the feed structure 110 may be as small as possible, for example from about 1.5 inches to about 12 inches, or about 5.8 inches, while maintaining a sufficient wall thickness of the feed structure 110 for mechanical integrity. In some embodiments, where no magnetron shaft is present as shown in FIG. 3, the outer diameter 250 of the feed structure 110 may be a small as about 0.5 inches. In such embodiments, the outer diameter 250 of the feed structure 110 may be, for example, from about 0.5 inches to about 12 inches.

Providing a smaller inner diameter (and a smaller outer diameter) facilitates improving the length to ID ratio (and the length to OD ratio) without increasing the length of the feed structure 110. Although described above as used to coupled both RF and DC energy to the target, the feed structure 110 may also be used to coupled just RF energy to the target, with DC energy either being not provided or coupled to the target from a different location. In such embodiments, the RF energy remains more uniformly provided to the target to facilitate more uniform plasma processing even though the DC energy, if provided, may not be as uniform as if provided via the feed structure 110.

The second end 116 of the body 112 is coupled to a source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening 115 of the body 112 via the hole 124 of the source distribution plate 122. The cavity 134 and the central opening 115 of the body 112 may be utilized to at least partially house one or more portions of a rotatable magnetron assembly 136 as illustrated in FIG. 1 and described further below. In some embodiments, the cavity may be at least partially filled with a cooling fluid, such as water ($H_2O$) or the like.

A ground shield 140 may be provided to cover the outside surfaces of the lid of the process chamber 100. The ground shield 140 may be coupled to ground, for example, via the ground connection of the chamber body. The ground shield 140 has a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

In some embodiments, a ground collar 141 may be disposed about body 112 and lower portion of the feed structure 110. The ground collar 140 is coupled to the ground shield 140 and may be an integral part of the ground shield 140 or a separate part coupled to the ground shield to provide grounding of the feed structure 110. The ground collar 140 may be made from a suitable conductive material, such as aluminum or copper. In some embodiments, a gap disposed between the inner diameter of the ground collar 141 and the outer diameter of the body 112 of the feed structure 110 may be kept to a minimum and be just enough to provide electrical isolation. The gap can be filled with isolating material like plastic or ceramic or can be an air gap. The ground collar 141 prevents cross-talk between the RF feed (e.g., electrical feed 205, discussed below) and the body 112, thereby improving plasma, and processing, uniformity.

An isolator plate 138 may be disposed between the source distribution plate 122 and the ground shield 140 to prevent the RF and DC energy from being routed directly to ground. The isolator plate 138 has a central opening to allow the feed structure 110 to pass through the isolator plate 138 and be coupled to the source distribution plate 122. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

Figure 2:
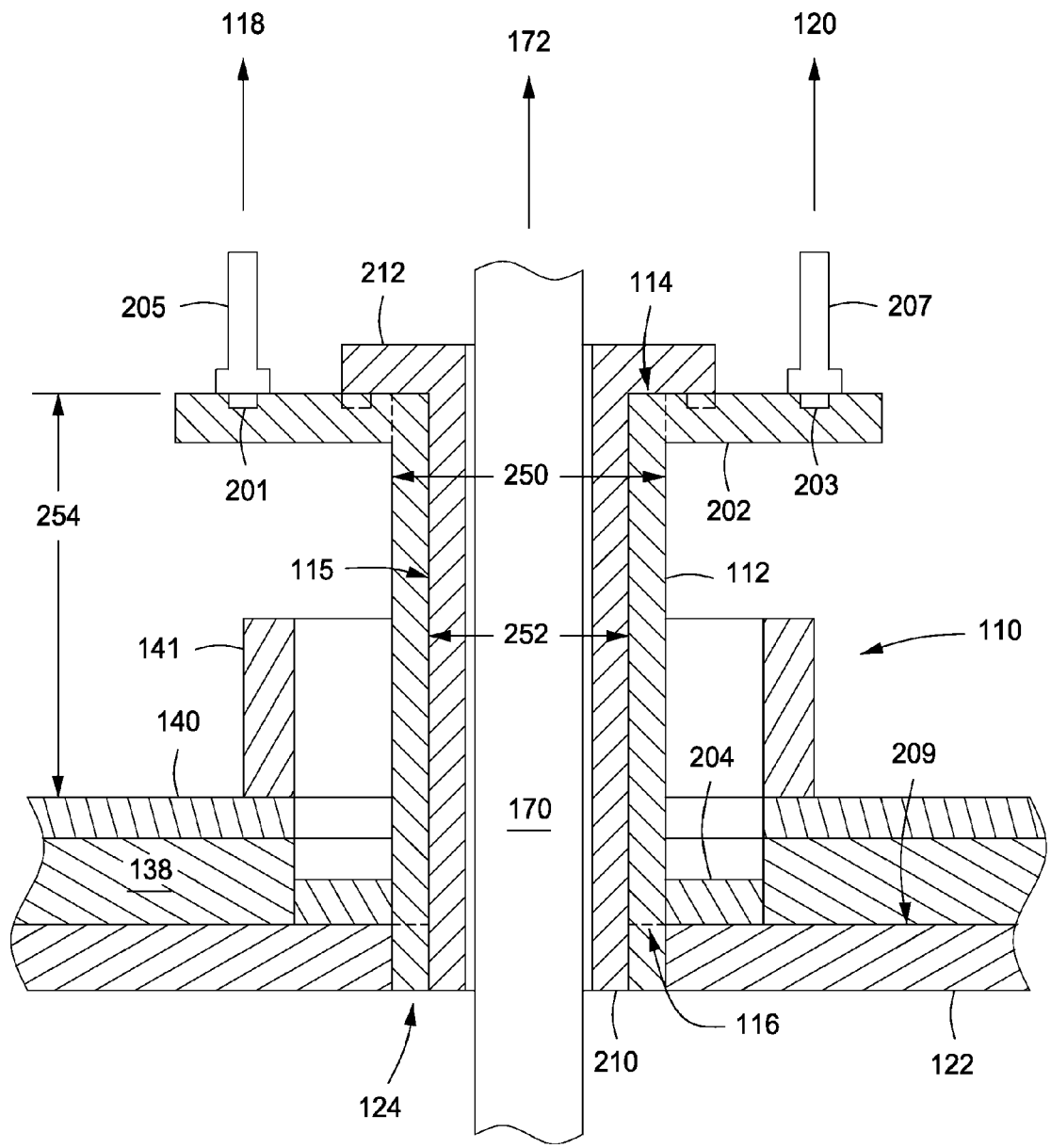
FIG. 2 depicts a schematic cross sectional view of a feed structure in accordance with some embodiments of the present invention.

FIG. 2 depicts the feed structure 110 in an expanded view and in greater detail than as illustrated in FIG. 1. In some embodiments, the feed structure 110 may include a first member coupled to the body 112 at or near the first end of the body 112 and extending radially outward therefrom to facilitate coupling the feed structure 110 to the energy sources as described below. For example, in some embodiments the feed structure 110 may include a first element 202 circumscribing the first end 114 of the body 112 and extending radially outward from the body 112. The first element 202 can be shaped in the form of an annular disk, or ring, as illustrated in FIG. 2. The first element 202 may be an integral part of the body 112, or alternatively, may be a separate element (as depicted by dotted lines proximate the first end 114) that can be coupled, such as by welding, brazing, clamping, bolting, or the like, onto the body 112 proximate the first end 114. The first element 202 comprises a conductive material, which can include similar materials as comprising the body 112.

Terminals 201, 203 can be disposed in the first element 202 to couple the RF power source 118 and the DC power source 120 respectively to the first element 202. For example, each terminal can be configured to accept an electrical feed 205, 207 for coupling the RF power source 118 and, in some embodiments, the DC power source 120 respectively to the terminals 201, 203. For example, the electrical feeds 205, 207 can be any suitable feed for coupling RF and/or DC energy, such as connection rods or the like. The terminals can be positioned in any suitable positions to achieve uniform layer deposition on the substrate 104 under at least high pressure conditions. For example, the terminals 201, 203 may be diametrically opposed about the central opening 115. Alternatively, the terminals 201, 203 may be asymmetrically disposed along a diameter of the first element 202 or in any suitable configuration for achieving the desired uniform deposition profile on the substrate 104. Alternatively, the RF and DC energy may be coupled to one or more common terminals in the first element 202 (e.g., a single terminal, or to both terminals 201, 203).

The first element 202 can be of any suitable diameter necessary to achieve uniform layer deposition on the substrate 104 under at least high pressure conditions. The first element 202 may have a diameter ranging from about 2 to about 20 inches. In some embodiments, the diameter of the first element 202 is about 10 inches. The inventors have discovered that coupling RF energy to the first element 202 may advantageously facilitate achieving even greater uniformity in electromagnetic field distribution of RF energy proximate the target than, for example, if the RF energy where directly coupled to the sidewall of the body 112, for example, by coupling the electrical feeds 205, 207 in a radially extending position from the sidewall of the body 112. Specifically, although coupling the RF energy directly to the sidewall of the body 112 may improve the RF energy distribution, the inventors have discovered that some non-uniformity still exists, and that further improvement may be made if the RF energy is coupled to the body more remotely from the source distribution plate (e.g., see the ratios of length to ID or OD of the body 112 discussed above, and/or coupling the RF energy to the first element 202).

In some embodiments, the feed structure 110 may include a second member coupled to the body 112 at or near the second end 116 to facilitate coupling the body 112 to the source distribution plate 122. In some embodiments, the second member may be a second element 204 circumscribing the second end 116 of the body 112. The second element 204 can be shaped in the form of an annular disk, or a flange, as illustrated in FIG. 2. The second element 204 may be an integral part of the body 112, or alternatively, may be a separate element (as depicted by dotted lines proximate the second end 116) that can be fastened, such as by welding, brazing, clamping, bolting, or the like, on to the body 112 proximate the second end 116. The second element 204 comprises a conductive material, which can include similar materials as comprising the body 112.

The second element 204 may be utilized to couple the feed structure 110 to a body-facing surface 209 of the source distribution plate 122 proximate the hole 124. The second element 204 may be any suitable diameter desired to provide structural support in the coupling of the feed structure 110 to the source distribution plate 122. For example, the second element 204 may have a diameter ranging from about 2 to about 12 inches. In some embodiments, the diameter of the second element 204 is about 7 inches.

In some embodiments, the feed structure 110 may include a third element 210 extending from the second end of the body 112 into the hole 124 of the source distribution plate 122. The third element 210 can tubular, and may be an extension of the body 112, as illustrated in FIG. 2. For example, the third element 210 can be provided to improve further structural stability of coupling between the feed structure 110 and the source distribution plate 122. Although drawn as extending from the body facing surface of the source distribution plate 122 to the target-facing surface 128 of the source distribution plate 122, the length of the third element 210 may be greater or lesser than as shown. Similar to the first and second elements 204, 202, the third element 210 may be a continuous part of the body 112, or alternatively, may be a separate element (as depicted by horizontal dotted lines proximate the second end 116) that can be fastened, such as by welding, brazing, clamping, bolting, or the like, onto the body 112 proximate the second end 116. The third element 210 comprises a conductive material, which can include similar materials as comprising the body 112.

In some embodiments, the feed structure 110 may further include a liner 212. The liner 212 may be disposed within the central opening 124 of the body 112. The liner 212 may line the central opening 124 from the first end 114 of the body 112 to target-facing surface 128 of the source distribution plate 122. The liner 212 may further be disposed partially atop the first end 114 of the body 112, for example, atop a portion of the first element 202 proximate the central opening 115 of the body 112. The liner 212 may comprise a dielectric material, for example, polytetrafluoroethylene (PTFE), a plastic, a ceramic, or the like. For example, the liner 212 may be utilized to electrically isolate the components of the magnetron assembly 136 from the conductive feed structure 110 and the RF and DC power sources 118, 120.

Figure 4A:
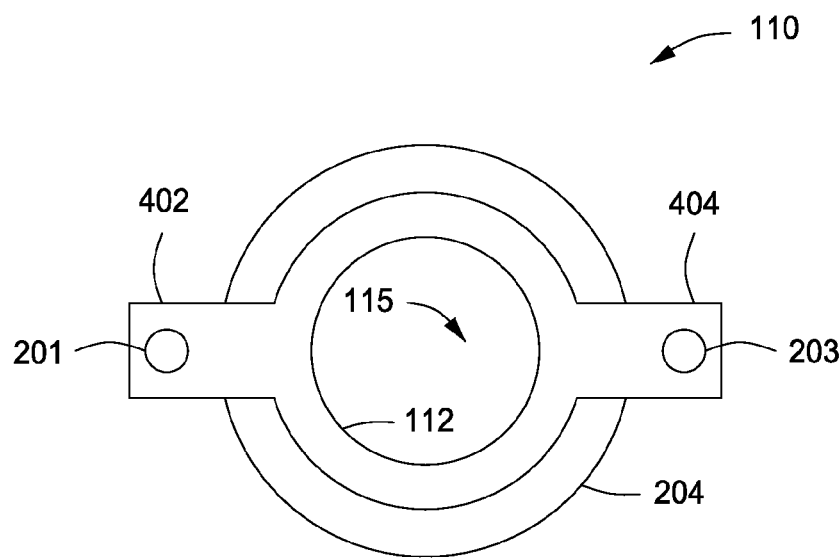
FIGS. 4A-F depict non-limiting examples of top views of other configurations of a feed structure in accordance with some embodiments of the present invention.

The configuration of the feed structure 110 depicted in FIG. 2 is illustrative only and other designs are contemplated. For example, FIGS. 4A-E depict non-limiting examples of top views of other configurations of the feed structure 110 in accordance with some embodiments of the present invention. FIG. 4A depicts a top view of the feed structure 110 where the first member comprises cantilevered arms 402, 404 disposed on opposing sides of the body 112 and extending radially outward away from the central opening 115. The terminals 201, 203 are respectively disposed in the arms 402, 404 to accept the electrical feeds 205, 207 respectively, which may be connection rods, such as an RF connection rod, DC connection rod, or the like.

In some embodiments, first member may further comprise a ring (e.g., the first element 202) coupled to the body 112 and having the cantilevered arms 402, 404 extending radially outward from the ring. In some embodiments of the apparatus, the inventors have discovered that the first element alone, while improving the uniformity of the electromagnetic field distribution proximate the target over conventional apparatus, may not provide as sufficient uniformity of the electromagnetic field distribution as desired. Accordingly, the inventors further discovered that providing one or more cantilevered arms extending radially from the first end 114 of the body 112, or from the first element may further improve the uniformity of the electromagnetic field distribution proximate the target.

As in any of the embodiments disclosed herein, RF energy may be applied to either or both of the terminals, optionally with DC energy application to either or both terminals as well. For example, in some embodiments, RF energy may be applied to the first terminal 201 and DC energy may be applied to the second terminal 203. Alternatively, RF energy may be applied to both the first terminal 201 and the second terminal 203. Alternatively, RF energy and DC energy may each be applied to both the first terminal 201 and the second terminal 203.

Figure 4B:
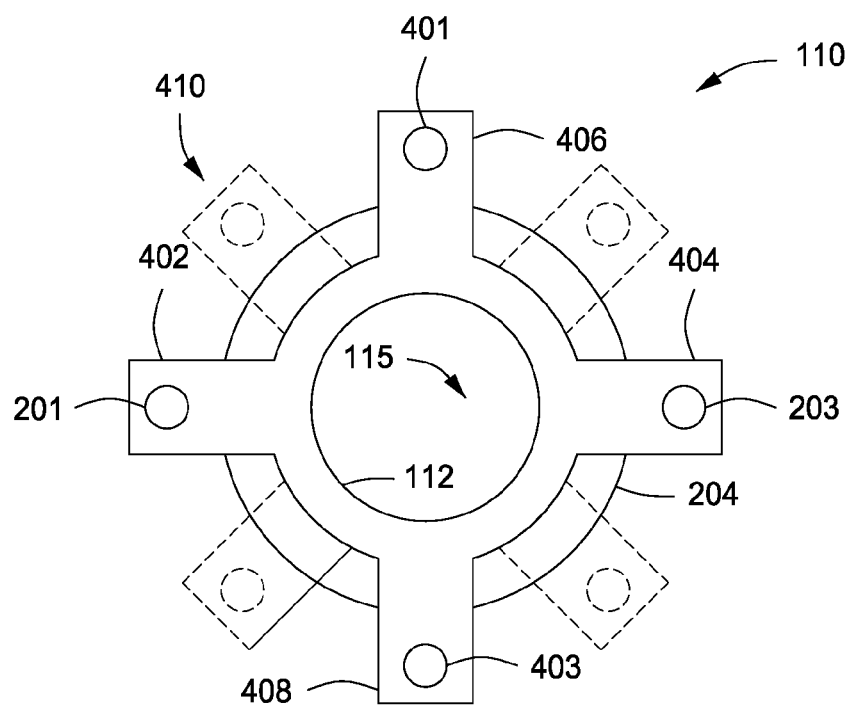

The number of locations for the application of RF (and/or DC) energy to the feed structure 110 may vary (e.g., one or more). In some embodiments, where more than one feed location is provided, such locations may be symmetrically disposed (such as the two opposing terminals 201, 203 depicted in FIG. 4A). For example, as depicted in FIG. 4B, more than two (four or eight shown) feed locations may be provided. FIG. 4B depicts a feed structure 110 having four cantilevered arms 402, 404, 406, 408. Each arm having a terminal (e.g., 201, 203, 401, 403) to couple to an RF or DC energy source. As shown in dashed lines labeled 410 in the drawing, additional cantilevered arms with terminals may be provided in a symmetrical arrangement as well. RF energy may be coupled to each of the terminals, or to opposing terminals and, in some embodiments, DC energy may be coupled to each of the terminals or opposing terminals. In some embodiments, RF energy may be provided to a first set of opposing terminals (for example, 201, 203) and DC energy may be provided to a second set of opposing terminals different than the first (for example, 401, 403). As in FIG. 4A, each of the cantilevered arms may extend radially outward from a ring that is coupled to the body 112.

Figure 4C:
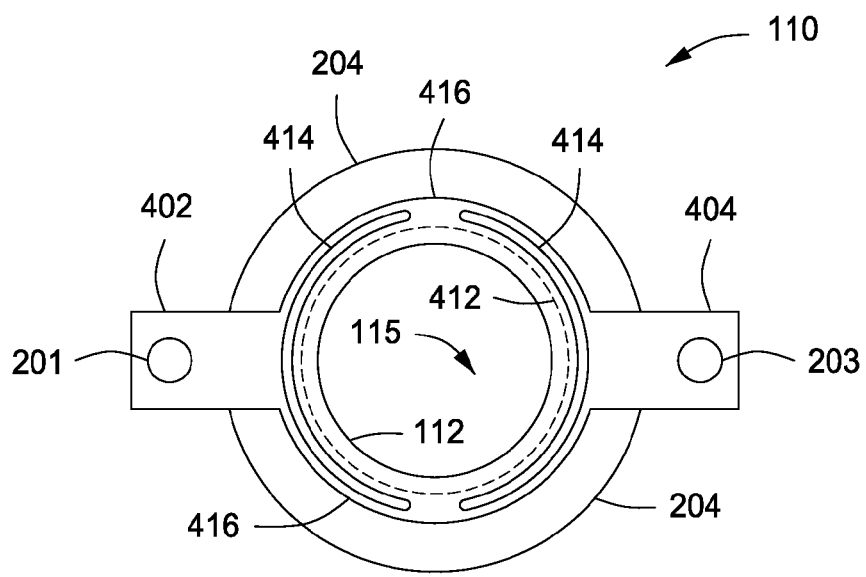

In some embodiments, the terminals may be coupled to the body 112 of the feed structure 110 at two or more discrete points, rather than continuously. For example, as shown in FIG. 4C, a slot 414 may be provided between each of the cantilevered arms 402, 404 and the body 112 to advantageously direct the energy applied to the terminals 203, 203 to contact regions 416. The slots 414 are formed at least partially radially outward of an outer wall 412 of the body 112 such that there is no conductive pathway from the terminal to the body across the slot 414 (e.g., the energy must travel around the slots 414). For example, the energy coupled to each terminal (either or both for RF energy and either or both for DC energy) is advantageously forced by the slot to propagate, for example, 90 degrees away from the terminal location, thus providing symmetric feed with even when only one RF and DC supply is coupled to the feed structure 110. The slots 414 may have any width suitable to prevent or minimize crosstalk between the opposing sides of the slot. For example, in some embodiments, the slot 414 may have a width of about ⅛ to about 2 inches, or in some embodiments, greater than about ½ an inch. In some embodiments, the slot 414 may have an arc length of from about 45 to about 90 degrees.

Figure 4D:
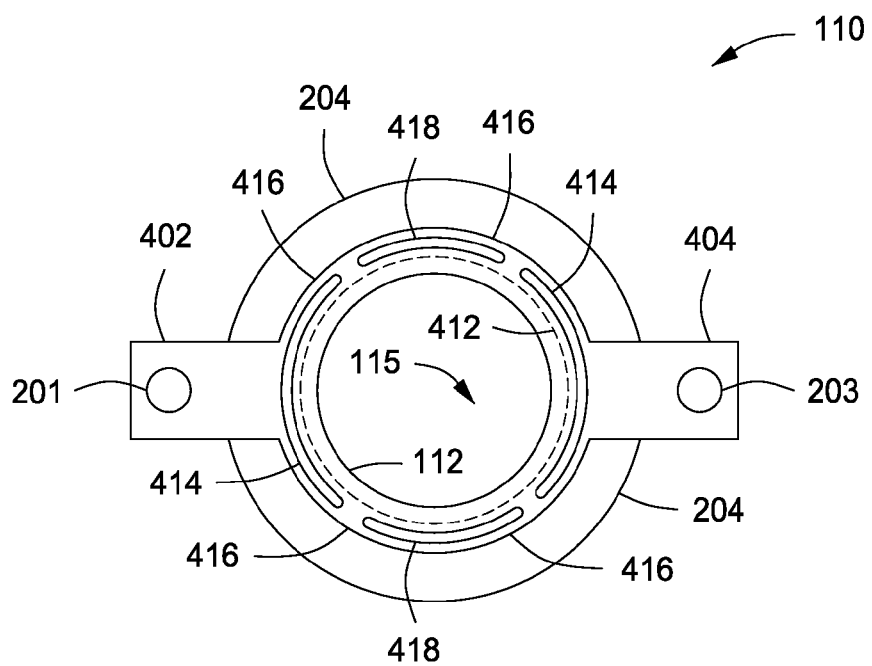

In some embodiments, as depicted in FIG. 4D, additional slots 418 may be provided to advantageously limit the size of the contact points 416 and to advantageously further control the precise location of the coupling of energy (RF or DC) from the respective terminals 201, 203 to the body 112 of the feed structure 110. In some embodiments, as shown in FIG. 4D, the slots 414, 416 may each have an arc length of slightly under 90 degrees to provide four contact points 416 having centers that are disposed every 90 degrees about the body 112 of the feed structure 110 and rotated about 45 degrees with respect to an imaginary line connecting the terminals 201, 203. In such embodiments, the distances from each terminal 201, 203 to the closest contact points 416 are about equal, thereby enhancing the symmetric application of the energy from the respective energy sources to the target via the feed structure 110.

Figure 4E:
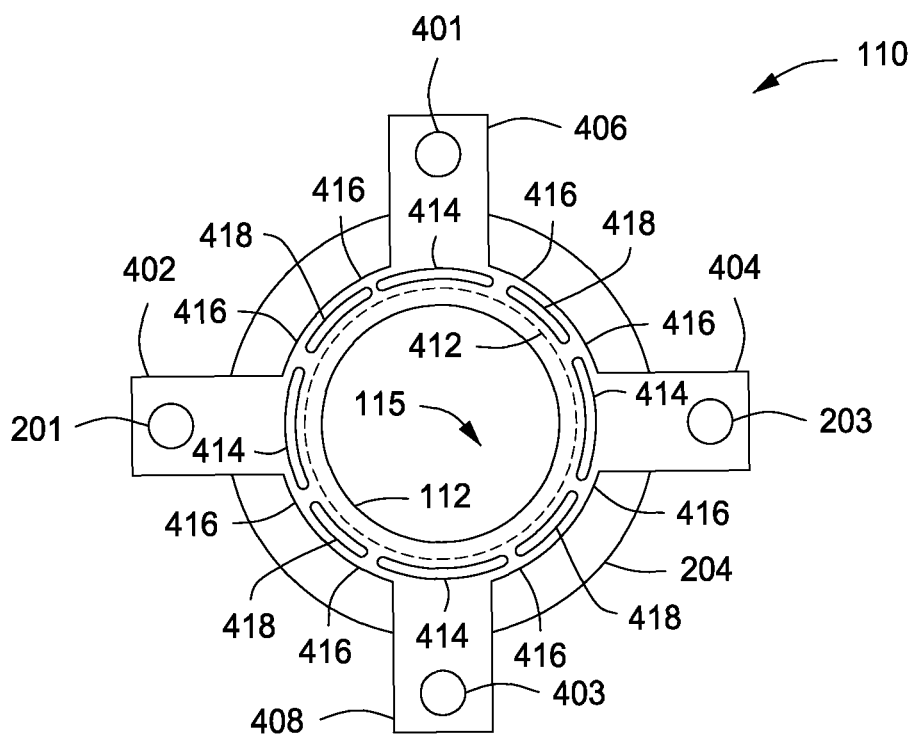

The different embodiments disclosed above may also be combined. For example, as depicted in FIG. 4E, a terminal (four terminals 201, 203, 401, 403 shown) may be provide on each of a plurality of cantilevered arms (four cantilevered arms 402, 404, 406, 408 shown) and a slot 414 may be provided between each cantilevered arm and the body 112 to direct the energy to contact points 416 disposed about the body 112. Additional slots 418 may be provided to further control the path of the energy applied to the terminals in the manner described above.

Figure 4F:
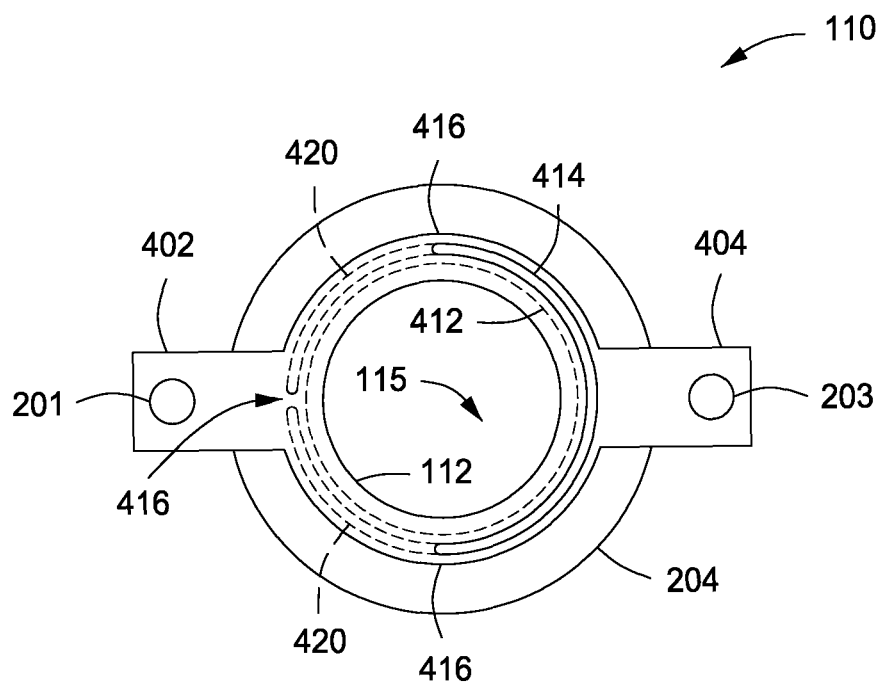

In some embodiments, as shown in FIG. 4F, a single slot 414 may be provided. The slot 414 may have an arc length of between about 90 to about slightly less than 360 degrees, or between about 180 to about slightly less than 360 degrees. The slot 414 may be provided adjacent to the terminal to which RF energy is applied (terminal 203 in FIG. 4F). Providing a single slot 414 in this manner provides a single contact point 416 for RF energy to travel from terminal 203 to the body 112 of the RF feed structure. Depending upon the arc length of the slot 414, the contact point 416 may vary in size. For example when the slot 414 has an arc length of about 180 degrees, the contact point 416 will extend about 180 degrees about the body 112. When the slot 414 has an arc length of slightly less than 360 degrees, the contact point 416 may be small. In such embodiments, the contact point 416 should be large enough to provide a robust contact point for the tab 404 to be coupled to the body 112.

The inventors have unexpectedly discovered that providing a controlled asymmetry to the RF feed, the symmetry of the RF energy ultimately reaching the target may be more symmetric. For example, due to a weak RF coupling across the slot 414 combined with a strong RF coupling along the contact point 416, a combined RF energy distribution traveling down the body 112 and to the distribution plate 122 (shown in FIG. 1) may be controlled to be more uniform, or symmetric. The inventors have further unexpectedly discovered that this effect varies based upon the frequency of the RF energy being provided. As such, the arc length of the slot 404 may be varied based upon the frequency of RF energy being used in order to control the symmetry of the RF energy provided to the target. In some embodiments, as shown in FIG. 4F a second terminal (terminal 201) may be provided to couple DC energy to the target. In some embodiments, the second terminal may be omitted.

Returning to FIG. 1, the target 106 may be supported on a grounded conductive aluminum adapter 142 through a dielectric isolator 144. The target 106 comprises a material to be deposited on the substrate 104 during sputtering, such a metal or metal oxide. In some embodiments, the backing plate 146 may be coupled to the source distribution plate-facing surface 132 of the target 106. The backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106.

The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in a central region 148 of the processing chamber 100. The central region 148 is defined as the region above the substrate support pedestal 102 during processing (for example, between the target 106 and the substrate support pedestal 102 when in a processing position).

In some embodiments, the substrate support pedestal 102 may be vertically movable through a bellows 150 connected to a bottom chamber wall 152 to allow the substrate 104 to be transferred onto the substrate support pedestal 102 through a load lock valve (not shown) in the lower portion of processing the chamber 100 and thereafter raised to a deposition, or processing position. One or more processing gases may be supplied from a gas source 154 through a mass flow controller 156 into the lower part of the chamber 100. An exhaust port 158 may be provided and coupled to a pump (not shown) via a valve 160 for exhausting the interior of the processing chamber 100 and facilitating maintaining a desired pressure inside the processing chamber 100.

An RF bias power source 162 may be coupled to the substrate support pedestal 102 in order to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHz, for example, non-limiting frequencies such as 2 MHz, 13.56 MHz, or 60 MHz can be used. In other applications, the substrate support pedestal 102 may be grounded or left electrically floating. For example, a capacitance tuner 164 may be coupled to the substrate support pedestal for adjusting voltage on the substrate 104 for applications where RF bias power may not be desired.

A rotatable magnetron assembly 136 may be positioned proximate a back surface (e.g., source distribution plate-facing surface 132) of the target 106. The rotatable magnetron assembly 136 includes a plurality of magnets 166 supported by a base plate 168. The base plate 168 connects to a rotation shaft 170 coincident with the central axis of the chamber 100 and the substrate 104. A motor 172 can be coupled to the upper end of the rotation shaft 170 to drive rotation of the magnetron assembly 136. The magnets 166 produce a magnetic field within the chamber 100, generally parallel and close to the surface of the target 106 to trap electrons and increase the local plasma density, which in turn increases the sputtering rate. The magnets 166 produce an electromagnetic field around the top of the chamber 100, and magnets 166 are rotated to rotate the electromagnetic field which influences the plasma density of the process to more uniformly sputter the target 106. For example, the rotation shaft 170 may make about 0 to about 150 rotations per minute.

In some embodiments, the chamber 100 may further include a grounded bottom shield 174 connected to a ledge 176 of the adapter 142. A dark space shield 178 may be supported on the bottom shield 174 and may be fastened to the bottom shield 174 by screws or other suitable manner. The metallic threaded connection between the bottom shield 174 and the dark space shield 178 allows the two shields 174, 178 to be grounded to the adapter 142. The adapter 142 in turn is sealed and grounded to the aluminum chamber sidewall 108. Both shields 174, 178 are typically formed from hard, non-magnetic stainless steel.

The bottom shield 174 extends downwardly and may include a generally tubular portion 180 having a generally constant diameter. The bottom shield 174 extends along the walls of the adapter 142 and the chamber wall 108 downwardly to below a top surface of the substrate support pedestal 102 and returns upwardly until reaching a top surface of the substrate support pedestal 102 (e.g., forming a u-shaped portion 184 at the bottom). A cover ring 186 rests on the top of the upwardly extending inner portion 188 of the bottom shield 174 when the substrate support pedestal 102 is in its lower, loading position but rests on the outer periphery of the substrate support pedestal 102 when it is in its upper, deposition position to protect the substrate support pedestal 102 from sputter deposition. An additional deposition ring (not shown) may be used to shield the periphery of the substrate 104 from deposition.

In some embodiments, a magnet 190 may be disposed about the chamber 200 for selectively providing a magnetic field between the substrate support pedestal 102 and the target 106. For example, as shown in FIG. 1, the magnet 190 may be disposed about the outside of the chamber wall 108 in a region just above the substrate support pedestal 102 when in processing position. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

Thus, apparatus for coupling RF and DC power are provided herein. The inventive apparatus advantageously allows for the coupling of RF and DC power to a target in a physical vapor deposition (PVD) chamber such that the target material can be uniformly distributed on a substrate. The inventive apparatus is beneficial to high pressure radio frequency (RF) PVD applications, such as pressures ranging from about 1 to about 500 mTorr. However, low pressure RF PVD can also benefit from the inventive apparatus disclosed herein.

While the foregoing is directed to embodiments of the present invention, other and further embodiments of the invention may be devised without departing from the basic scope thereof.

The invention claimed is:

1. A feed structure to couple RF energy to a target in a physical vapor deposition chamber, comprising:
   a body having a first end to receive RF energy and a second end opposite the first end to couple the RF energy to a target, the body further having a central opening disposed through the body from the first end to the second end;
   a first member coupled to the body at the first end, wherein the first member comprises a first element circumscribing the body and extending radially outward from the body, and one or more terminals disposed in the first member to receive RF energy from an RF power source; and
   a source distribution plate coupled to the second end of the body to distribute the RF energy to the target, wherein the source distribution plate includes a hole disposed through the plate and aligned with the central opening of the body.

2. The feed structure of claim 1, wherein the body has a length sufficient to distribute the RF energy about the periphery of the feed structure such that the RF energy is substantially uniformly provided to the source distribution plate.

3. The feed structure of claim 2, wherein a ratio of the length of the body to an outer diameter of the body is at least about 0.5:1.

4. The feed structure of claim 1, wherein the first member further comprises:
   one or more cantilevered arms extending from the first element, wherein a terminal of the one or more terminals is disposed in each cantilevered arm; and
   one or more slots disposed in the first element, wherein at least one slot of the one or more slots is disposed between at least one terminal of the one or more terminals and the body to direct energy from the at least one terminal to the body around the one or more slots.

5. The feed structure of claim 4, wherein the one or more cantilevered arms further comprises:
   two or more cantilevered arms, wherein the two or more cantilevered arms are symmetrically disposed about the first element.

6. The feed structure of claim 4, wherein the one or more slots consists of a single slot, wherein the single slot has an arc length of about 180 to about less than 360 degrees.

7. The feed structure of claim 6, wherein the one or more cantilevered arms consists of one cantilevered arm extending from the first element, and wherein the terminal is disposed in an end of the one cantilevered arm opposing the first element.

8. An apparatus for physical vapor deposition, comprising:
   an RF power source to provide RF energy;
   a process chamber having a substrate support disposed in an interior of the process chamber and a target disposed in the interior of the process chamber facing a support surface of the substrate support;
   a source distribution plate disposed outside of the process chamber and coupled to a backside of the target along a peripheral edge of the target to distribute the RF energy proximate the peripheral edge of the target; and
   a body having a first end, a second end opposite the first end, a central opening disposed through the body from the first end to the second end, and a first member coupled to the body at the first end;
   wherein the first member comprises a first element circumscribing the body and extending radially outward from the body, and one or more terminals disposed in the first member, wherein at least one of the one or more terminals are coupled to the RF power source; and
   wherein the second end of the body is coupled to the source distribution plate on a first side of the source distribution plate opposite the target.

9. The apparatus of claim 8, wherein the body has a length sufficient to distribute the RF energy about the periphery of the feed structure such that the RF energy is substantially uniformly provided to the source distribution plate.

10. The apparatus of claim 9, wherein a ratio of a length of the body to an outer diameter of the body is at least about 0.5:1.

11. The apparatus of claim 8, further comprising:
    a rotating magnetron assembly including a magnet and a shaft to rotate the magnet proximate the backside of the target, wherein the shaft is coaxial with respect to a central axis extending perpendicularly from the target, and wherein the shaft is disposed through the central opening of the body and a corresponding hole disposed through the source distribution plate.

12. The apparatus of claim 11, further comprising:
    a liner comprising a dielectric material disposed with the central opening of the body between the body and the shaft of the magnetron assembly.

13. The apparatus of claim 8, wherein the body further comprises:
    a second element circumscribing the second end of the body, the second element coupling the body to the first side of the source distribution plate.

14. The apparatus of claim 8, wherein the first member further comprises:
    one or more cantilevered arms extending from the first element, wherein a terminal of the one or more terminals is disposed in each cantilevered arm of the one or more cantilevered arms; and one or more slots disposed in the first element, wherein at least one slot of the one or more slots is disposed between at least one terminal of the one or more terminals and the body to direct energy from the at least one terminal to the body around the at one or more slots.

15. The apparatus of claim 14, wherein the one or more cantilevered arms further comprises:
two or more cantilevered arms, wherein the two or more cantilevered arms are symmetrically disposed about the first element.

16. The apparatus of claim 14, wherein the one or more slots consists of a single slot, wherein the single slot has an arc length of about 180 to about less than 360 degrees.

17. The apparatus of claim 16, wherein the one or more cantilevered arms consists of one cantilevered arm extending from the first element, and wherein the terminal is disposed in an end of the one cantilevered arm opposing the first element.

18. The apparatus of claim 8, further comprising:
a DC power source coupled to the target to provide DC energy to the target.

19. An apparatus for physical vapor deposition, comprising:
an RF power source to provide RF energy;
a process chamber having a substrate support disposed in an interior of the process chamber and a target disposed in the interior of the process chamber facing a support surface of the substrate support;
a source distribution plate disposed outside of the process chamber and coupled to a backside of the target along a peripheral edge of the target to distribute the RF energy proximate the peripheral edge of the target; and
a body having a first end, a second end opposite the first end, a central opening disposed through the body from the first end to the second end, and a first member coupled to the body at the first end;
wherein the first member comprises a first element circumscribing the body and extending radially outward from the body, a cantilevered arm extending from the first element, a terminal disposed in the cantilevered arm to receive the RF energy from the RF power source, and a slot disposed through the first element between the terminal and the body to direct the RF energy from the terminal to the body around the slot, wherein the slot has an arc length of about 180 to about less than 360 degrees; and
wherein the second end of the body is coupled to the source distribution plate on a first side of the source distribution plate opposite the target.

20. The apparatus of claim 19, further comprising:
a DC power source to provide DC energy, wherein the DC power source is coupled to the target via one or more of:
the terminal of the cantilevered arm; or
a second terminal disposed in a second cantilevered arm, wherein the cantilevered arm and the second cantilevered arm are disposed symmetrically about the first element.

* * * * *